(12) United States Patent
Son et al.

(10) Patent No.: US 10,303,016 B2
(45) Date of Patent: May 28, 2019

(54) DISPLAY DEVICE AND METHOD FOR MANUFACTURING THE SAME

(71) Applicant: Samsung Display Co., Ltd., Yongin-Si, Gyeonggi-Do (KR)

(72) Inventors: Jeongman Son, Suwon-si (KR); Seung-won Kuk, Cheonan-si (KR); Yun-gun Lee, Asan-si (KR); Jong-keun Kim, Seoul (KR); Jikhan Jung, Seoul (KR); Duyeon Han, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/666,620

(22) Filed: Aug. 2, 2017

(65) Prior Publication Data

US 2018/0067354 A1 Mar. 8, 2018

(30) Foreign Application Priority Data

Sep. 7, 2016 (KR) .................. 10-2016-0115212

(51) Int. Cl.
*G02F 1/1345* (2006.01)
*G02F 1/1333* (2006.01)
(Continued)

(52) U.S. Cl.
CPC ...... *G02F 1/13452* (2013.01); *H01L 23/4985* (2013.01); *H01L 24/50* (2013.01);
(Continued)

(58) Field of Classification Search
CPC ......... H01L 27/3276; H01L 2251/5338; H01L 51/0097; H01L 2224/73265; H01L 24/81; G02F 1/13452; G02F 1/13458; G02F 1/133305; G02F 1/133345; G02F 1/136286; G02F 1/134309; G02F 1/1345; G02F 1/13454; G02F 1/13306; G02F 1/1333;
(Continued)

(56) References Cited

U.S. PATENT DOCUMENTS

| 2013/0182212 A1* | 7/2013 | Nakamura ........ G02F 1/134336 349/149 |
| 2014/0339574 A1* | 11/2014 | Kang .................... H01L 27/124 257/88 |

FOREIGN PATENT DOCUMENTS

| KR | 1020140136233 A | 11/2014 |
| KR | 1020140136237 A | 11/2014 |

(Continued)

*Primary Examiner* — Thoi V Duong
(74) *Attorney, Agent, or Firm* — Cantor Colburn LLP

(57) ABSTRACT

A display device includes a display panel which displays an image, the display panel including a display signal line and a pad electrode which extends from the display signal line, a flexible film from which a display signal is provided to the pad electrode of the display panel, the flexible film including a base film attached to a side surface of the display panel and including a front surface facing away from the side surface of the display panel, and a wiring electrode disposed on the front surface of the base film and, an adhesion member configured to attach the flexible film to the side surface of the display panel, and a connection electrode directly bonded to the pad electrode of the display panel and the wiring electrode of the flexible film to electrically connect the display signal line of the display panel to the wiring electrode.

17 Claims, 8 Drawing Sheets

(51) Int. Cl.
  *H01L 23/498* (2006.01)
  *H01L 23/00* (2006.01)
  *H01L 27/12* (2006.01)
  *H05K 1/11* (2006.01)
  *H05K 1/14* (2006.01)
  *H05K 1/18* (2006.01)
  *G02F 1/1368* (2006.01)

(52) U.S. Cl.
  CPC ............ *H01L 27/124* (2013.01); *H05K 1/111* (2013.01); *H05K 1/144* (2013.01); *H05K 1/189* (2013.01); *G02F 1/1368* (2013.01); *H01L 2924/1426* (2013.01); *H05K 1/147* (2013.01); *H05K 2201/049* (2013.01); *H05K 2201/10128* (2013.01); *H05K 2201/10681* (2013.01)

(58) Field of Classification Search
  CPC .......... G02F 2001/133388; G02F 2001/13629; G09G 2300/0426; G09G 2380/02; G09G 5/003; G09G 5/10; H05K 1/111; H05K 1/028; H05K 1/0393; H05K 3/32; H05K 3/305; H05K 3/363; H05K 2201/09145; H05K 2201/09209; H05K 2201/10136; H05K 2201/10681; H05K 2201/10984; H05K 2201/2009
  See application file for complete search history.

(56) References Cited

FOREIGN PATENT DOCUMENTS

| | | |
|---|---|---|
| KR | 1020150011731 A | 2/2015 |
| KR | 1020150047711 A | 5/2015 |
| KR | 1020150072743 A | 6/2015 |
| KR | 1020150074275 A | 7/2015 |

* cited by examiner

_DISPLAY DEVICE AND METHOD FOR MANUFACTURING THE SAME_

This application claims priority to Korean Patent Application No. 10-2016-0115212, filed on Sep. 7, 2016, and all the benefits accruing therefrom under 35 U.S.C. § 119, the contents of which in their entirety are hereby incorporated by reference.

BACKGROUND

(1) Field

The present disclosure herein relates to a display device and a method for manufacturing the same, and more particularly, to a display device that is capable of reducing a size of a bezel area thereof and a method for manufacturing the same.

(2) Description of the Related Art

Generally, in a method for manufacturing display devices, a bonding process for electrically connecting a display panel to a driving chip is performed in module assembly equipment that is post-process equipment for the display panel. This bonding process is classified into a chip on glass ("COG") mounting manner and a tape automated bonding ("TAB") mounting manner according to driving chip mounting manners.

In the COG mounting manner, the driving chip is directly mounted on a gate area and a data area of the display panel to transmit an electrical signal to the display panel. Here, the driving chip is generally bonded to the display panel by using an anisotropic conductive film ("ACF").

In the TAP mounting manner, a tape carrier package on which the driving chip is mounted is bonded to the display panel. This manner may also be performed by bonding the display panel to one end of the tape carrier package by using the ACF and bonding a printed circuit board on the other end of the tape carrier package.

SUMMARY

One or more exemplary embodiment provides a display device that is capable of improving contact reliability between a display panel and a flexible film attached to each other in a side bonding structure capable of reducing an overall size of a bezel area of the display device.

One or more exemplary embodiment also provides a method for manufacturing the display device.

An embodiment of the invention provides a display device including: a display panel which displays an image, the display panel including a display signal line and a pad electrode which extends from the display signal line; a flexible film from which a display signal is provided to the pad electrode of the display panel, the flexible film including: a base film attached to a side surface of the display panel and including a front surface facing away from the side surface of the display panel, and a wiring electrode disposed on the front surface of the base film; an adhesion member configured to attach the flexible film to the side surface of the display panel; and a connection electrode directly bonded to the pad electrode of the display panel and the wiring electrode of the flexible film to electrically connect the display signal line of the display panel to the wiring electrode of the flexible film.

In an embodiment of the invention, a method for manufacturing a display device includes: coupling a first substrate including a display signal line and a pad electrode which extends from the display signal line, to a second substrate facing the first substrate, to form a display panel which displays an image; forming an adhesion member on a side surface of the first substrate of the display panel; preparing a flexible film from which a display signal is provided to the pad electrode of the display panel, the flexible film including a base film and a wiring electrode which is disposed on a front surface of the base film; attaching the flexible film to the side surface of the first substrate, by disposing the adhesion member between a rear surface of the base film opposite to the front surface thereof, and the side surface of the first substrate; and forming a connection electrode extended from an exposed end portion of the wiring electrode of the flexible film to an exposed end portion of the pad electrode of the display panel, to physically and electrically connect the wiring electrode to the pad electrode.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
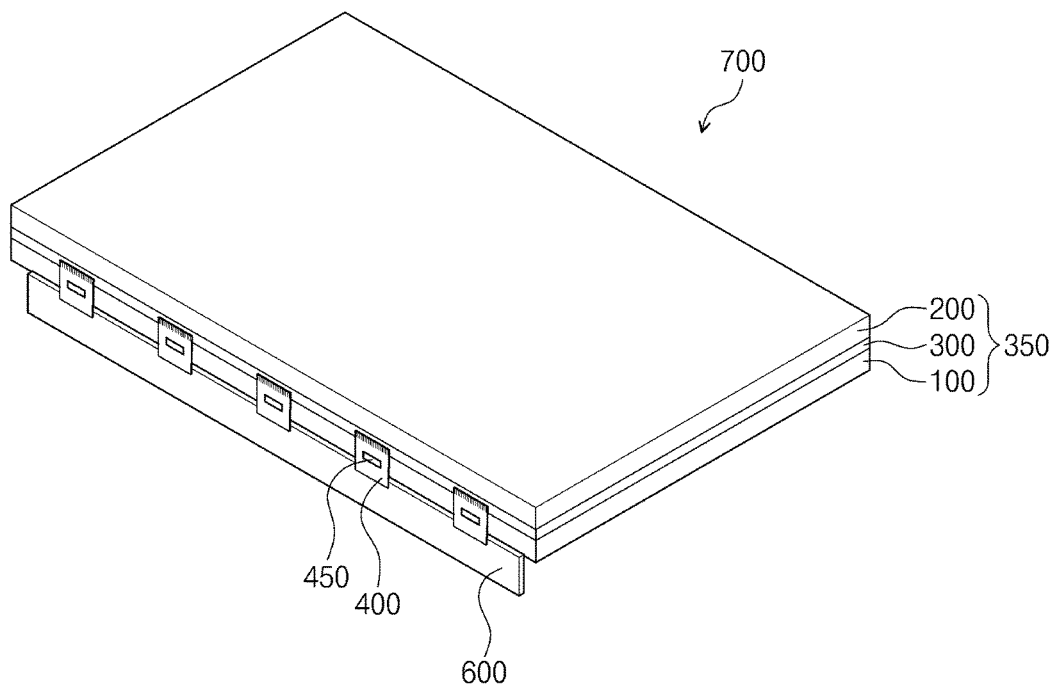
FIG. 1 is a perspective view of an exemplary embodiment of a display device according to the invention.

Since the present disclosure may have diverse modified embodiments, specific embodiments are illustrated in the drawings and are described in the detailed description of the invention. However, this does not limit the present disclosure within specific embodiments and it should be understood that the present disclosure covers all the modifications, equivalents, and replacements within the idea and technical scope of the present disclosure.

Like reference numerals refer to like elements throughout. In the drawings, the dimensions and size of each structure are exaggerated, omitted, or schematically illustrated for convenience in description and clarity.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims.

The terms of a singular form may include plural forms unless referred to the contrary. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. The meaning of 'include' or 'comprise' specifies a property, a region, a fixed number, a step, a process, an element and/or a component but does not exclude other properties, regions, fixed numbers, steps, processes, elements and/or components.

In the specification, it will be understood that when a layer (or film), a region, or a plate is referred to as being 'on' another layer, region, or plate, it can be directly on the other layer, region, or plate, or intervening layers, regions, or plates may also be present. On the contrary to this, when a layer (or film), a region, or a plate is referred to as being 'directly on' another layer, region, or plate, intervening layers, regions, or plates are present. As used herein, when one element is "connected" to another element, the connection may be physical and/or electrical.

It will be understood that when a layer, a film, a region, or a plate is referred to as being 'under' another layer, film, region, or plate, it can be directly under the other layer, film, region, or plate, or intervening layers, films, regions, or plates may also be present. Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the invention will be described below in more detail with reference to the accompanying drawings.

The objects, means to solve the objects, and effects of the invention will be readily understood through embodiments related to the accompanying drawings. Each drawing may be partly simplified or exaggerated for clarity of illustration. Note that the same or similar components in the drawings are designated by the same reference numerals as far as possible even if they are shown in different drawings. Moreover, detailed descriptions related to well-known functions or configurations will be ruled out in order not to unnecessarily obscure subject matters of the invention.

Figure 2:
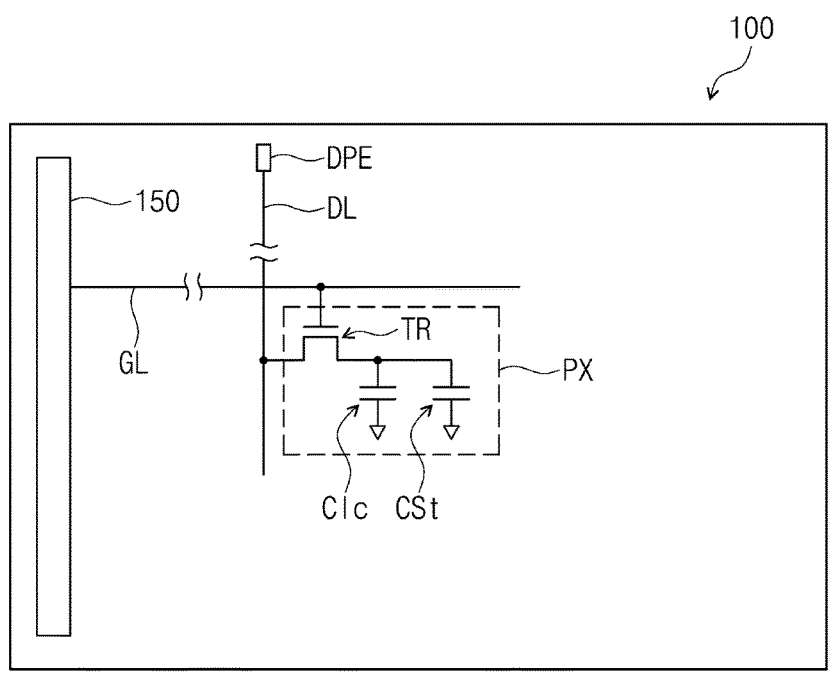
FIG. 2 is a schematic top plan view of an exemplary embodiment of a first substrate of the display device of FIG. 1 according to the invention.

FIG. 1 is a perspective view of an exemplary embodiment of a display device according to the invention, and FIG. 2 is a schematic top plan view of a first substrate of the display device of FIG. 1.

Referring to FIG. 1, an exemplary embodiment of a display device 700 according to the invention includes a display panel 350 which generates and displays an image and a data-side flexible film 400 which is attached to a side surface of the display panel 350. A viewing side of the display device 700 is defined at the upper side of FIG. 1, and a top plan view is taken from the viewing side toward the display device 700.

In an exemplary embodiment, for example, the display panel 350 may include an organic light emitting display panel, a liquid crystal display panel, a plasma display panel, an electrophoretic display panel, a microelectromechanical system ("MEMS") display panel and/or an electrowetting display panel. Although the display panel 350 including the liquid crystal display panel is exemplified in the exemplary embodiment of the display device 700 according to the invention, the invention is not limited thereto.

The display panel 350 may include a first (display) substrate 100, a second (display) substrate 200 which is coupled to face the first substrate 100, and an optical medium layer such as a liquid crystal layer 300 disposed between the first substrate 100 and the second substrate 200.

A pixel PX and a (display) signal line which is connected to the pixel PX are disposed in the first substrate 100 such as disposed on a base substrate of the first substrate 100. The pixel PX may be provided in plurality, and the plurality of pixels PX may be disposed in the first substrate 100 in the form of a matrix. However, for convenience of description, one pixel PX will be illustrated and described below. The pixel PX and the signal line may be disposed in a display area of the display device 700, where an image is generated and displayed at the display area. The display device 700 may also include a non-display area at which the image is not displayed.

The pixel PX includes a thin film transistor TR, a liquid crystal capacitor Clc, and a storage capacitor CSt. The signal line may be provided in plurality, and the plurality of signal lines may include a gate line GL and a data line DL. The gate line GL and/or the data line DL may be provided in plurality, but for convenience of description, one each of the gate line GL and the data line DL will be illustrated and described below. The gate line GL is connected to a gate electrode (not shown) of the thin film transistor TR, and the data line DL is connected to a source electrode (not shown) of the thin film transistor TR. A drain electrode (not shown) of the thin film transistor TR is connected to a first electrode (e.g., a pixel electrode) as a terminal of the liquid crystal capacitor Clc.

According to an embodiment of the invention, a gate driving circuit 150 connected to the gate line GL to supply a gate signal to the gate line GL may be further disposed in on the first substrate 100 such as on the base substrate thereof. Elements and layers of the gate driving circuit 150 in the non-display area may be formed together with the thin film transistor TR in the display area, at the same time on the base substrate of the first substrate 100 such as through the same process. That is, the elements and layers of the gate driving circuit 150 and the thin film transistor TR may be in a same layer as each other within the first substrate 100 among layers on the base substrate thereof.

The first substrate 100 further includes a data pad electrode DPE extending from the data line DL. The data pad electrode DPE may extend from one end of the data line DL and be disposed at an end or edge portion of one side of the first substrate 100 which corresponds to the end of the data line DL. The data line DL may extend to define the data pad electrode DPE.

Referring again to FIG. 1, the data-side flexible film 400 may have a first end attached to the side surface of the display panel 350 and a second end opposite to the first end and attached to a printed circuit board 600. In the illustrated embodiment, the side surface of the display panel 350 may be defined as a side surface of the first substrate 100. The side surface of the display panel 350 to which the data-side flexible film 400 is attached may be defined by only a side surface of the first substrate 100 among side surfaces of the first and second substrates 100 and 200.

The data-side flexible film 400 may have a length and a width (refer to major surface viewable in FIG. 1), and a thickness taken in a direction away from the display panel 350. In a planar view, a total planar dimension of the data-side flexible film 400 viewed in a thickness direction is smaller than a total planar dimension of the major surface. In an embodiment, a total planar area of the front surface of the data-side flexible film 400 defines a major planar dimension of the data-side flexible film 400. A thickness of the data-side flexible film 400 is taken from the front surface thereof to the side surface 113 of the display panel 350, and a total planar area of the data-side flexible film 400 in a thickness view thereof defines a minor planar dimension of the data-side flexible film 400. In a top plan view of the display panel 350, a total thickness of the data-side flexible film 400 may be disposed in a non-display area and/or bezel area of the display panel 350 and/or the display device 700.

A data driving chip 450 may be mounted on the data-side flexible film 400. A data driving circuit (not shown) for generating and/or supplying a data signal to the data line DL may be built into the data driving chip 450. The printed circuit board 600 may generate and/or supply an image data signal and a data control signal to the data driving chip 450 through the data-side flexible film 400, and also supply a gate control signal to the data driving circuit 150 through signal lines (not shown) at the data-side flexible film 400 and the first substrate 100.

The data-side flexible film 400 may transmit the signals outputted from the printed circuit board 600 to the data driving chip 450 and/or the display panel 350. Also, the data-side flexible film 400 may transmit the data signal outputted from the data driving chip 450 to the display panel 350.

As described above, to transmit the signals to the display panel 350, the data-side flexible film 400 may be bonded to the display panel 350 so as to be electrically connected thereto, that is, electrically bonded to the display panel 350. A bonding structure between the data-side flexible film 400 and the display panel 350 will be described in detail with reference to FIGS. 3 and 4.

Figure 3:
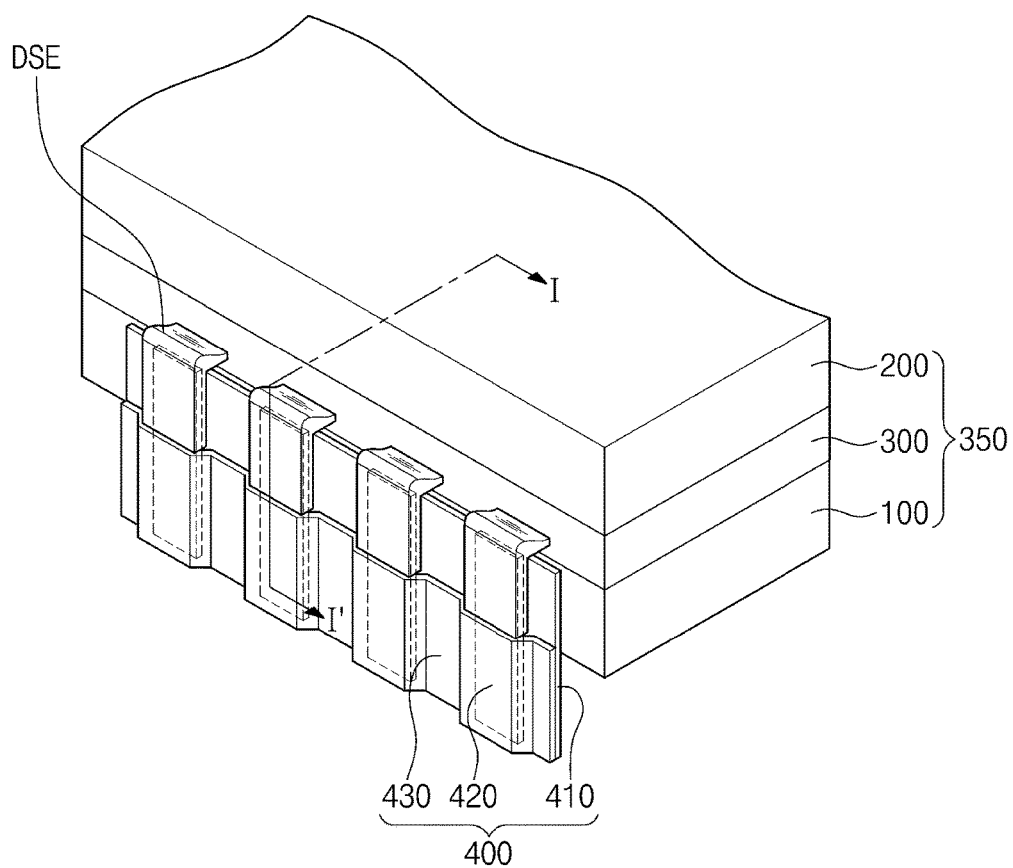
FIG. 3 is a perspective side view of an exemplary embodiment of an edge portion of the display device of FIG. 1 according to the invention.
Figure 4:
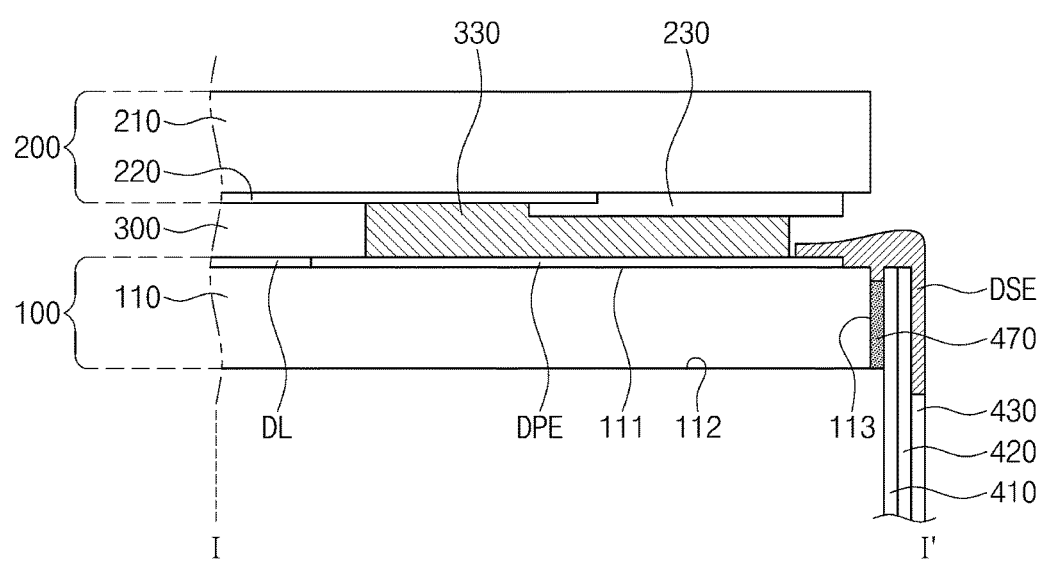
FIG. 4 is a cross-sectional view of the edge portion of the display device taken along line I-I' of FIG. 3.

FIG. 3 is a perspective side view of an exemplary embodiment of an edge portion of the display device of FIG. 1, and FIG. 4 is a cross-sectional view of the edge portion of the display device taken along line I-I' of FIG. 3.

Referring to FIGS. 3 and 4, the first substrate 100 includes a first base substrate 110. The first base substrate 110 includes a first surface 111, a second surface 112 which is opposite to the first surface 111, and a side surface 113 connecting the first surface 111 to the second surface 112. According to an exemplary embodiment of the invention, the first surface 111 may be an inner surface facing the second substrate 200, and the second surface 112 may be an outer surface opposite to the first surface 111. The first surface 111 may be in a plane parallel to a plane defined in first and second directions, such as the major surface of the display panel 350 illustrated in FIG. 1. A thickness direction of the display panel 350 may be defined in a third direction crossing the first and second directions, such as being perpendicular to both the first and second directions. The side surface 113 may be in a plane parallel to a plane defined in the first and third or the second and third directions.

The data line DL and the data pad electrode DPE of FIG. 2 are disposed on the first surface 111 of the first base substrate 110.

For convenience of description, although other members except for the data line DL and the data pad electrode DPE are omitted, other members disposed on the first substrate 100 may be disposed on the first base substrate 110 such as on the first surface 111 thereof.

The data-side flexible film 400 is attached to the side surface 113 of the first base substrate 110.

The data-side flexible film 400 may be disposed extended parallel to the side surface 113 of the first substrate 100. The data-side flexible film 400 includes a base film 410, a wiring electrode 420 disposed on a front surface of the base film 410, and a cover film 430 covering the wiring electrode 420. Each of the base film 410, the wiring electrode 420 and the cover film 430 may be disposed in planes parallel to that of the side surface 113.

The base film 410 may include or be made of a flexible material, e.g., polyimide. The wiring electrode 420 may be connected to the data driving chip (see reference numeral 450 of FIG. 1) to receive a signal outputted from the data driving chip 450. The wiring electrode 420 has an end exposed by the cover film 430. The wiring electrode 420 may include or be made of a metal material including copper (Cu), silver (Ag), gold (Au), or aluminum (Al).

The display device 700 further includes an adhesion member 470 disposed between the data-side flexible film 400 and the side surface 113 of the first substrate 100 to attach the data-side flexible film 400 to the side surface 113. Particularly, the adhesion member 470 is disposed between a rear surface of the base film 410 opposite to the front surface thereof and the side surface 113 of the first substrate 110.

The adhesion member 470 includes or is made of a material having adhesive force. The adhesion member 470 physically fixes the data-side flexible film 400 to the side surface 113 of the first substrate 100. The adhesion member 470 may include an arc polymer resin or a thermoplastic resin. The thermoplastic resin may be a vinyl acetate resin, a styrene resin, an ethylene-vinyl acetate copolymerization resin, or a styrene-butadiene copolymerization resin. Alternatively, the thermoplastic resin may be a polyester resin.

The display device 700 may further include a data connection electrode DSE that is directly bonded to the data pad electrode DPE and the wiring electrode 420 to electrically connect the data line DL to the wiring electrode 420. The data connection electrode DSE may include a metal material such as including silver (Ag) or carbon (C).

At the end portion of the first substrate 100, a distal portion of the data pad electrode DPE may be exposed to outside the display panel 350. The exposed distal portion of the data pad electrode DP3 is directly bonded to the data connection electrode DSE at the end portion of the first substrate 100. The data connection electrode DSE covers the exposed portion of the data pad electrode DPE. The data connection electrode DSE may be disposed on an upper surface of the exposed portion of the data pad electrode DPE and extend along side surfaces thereof toward the base substrate 110. That is, the data connection electrode DSE is disposed in two planes. One plane is parallel to a plane of the first surface 111 of the first base substrate 110 and another plane is parallel to a plane of the side surface 113 of the first base substrate 110. A front surface of the data connection electrode DSE may be coplanar with a front surface of the cover film 430, but the invention is not limited thereto.

Also, the data connection electrode DSE covers an end of the wiring electrode 420, which is not covered by the cover film 430. The data connection electrode DSE may overlap an entirety of the front surface and the side surfaces of the wiring electrode 420 exposed by the cover film 430. According to an embodiment of manufacturing the display device, the data connection electrode DSE may be formed in a printing or soldering manner. The data connection electrode DSE is physically bonded to the data pad electrode DPE and the wiring electrode 420 to provide a path for electrically conducting the data pad electrode DPE to the wiring electrode 420. The data connection electrode DSE is common to both the data pad electrode DPE and the wiring electrode 420.

The second substrate 200 includes a second base substrate 210 facing the first base substrate 110. A common electrode 220 may be disposed on the second base substrate 210. The common electrode 220 forms a second electrode of the liquid crystal capacitor Clc of FIG. 2. The common electrode 220 may be disposed on a lower side of the second base substrate 210. Although the common electrode 220 may be disposed in the first substrate 100 in an alternative embodiment, the common electrode 220 disposed at a lower side of the second substrate 200 will be exemplified in FIGS. 3 and 4.

When the common electrode 220 is disposed at the lower side of the second substrate 200, the second substrate 200 may further include an insulation structure 230. The insulation structure 230 is disposed on the common electrode 220 to cover an end of the common electrode 220. The insulation structure 230 may include or be made of an inorganic insulation material or an organic insulation material. According to another embodiment, the insulation structure 230 may include or be made of an organic black matrix ("BM") material.

The insulation structure 230 may be disposed extended in an extension direction of the side surface 113 of the first substrate 100 at which the data-side flexible film 400 is attached. A length of the data-side flexible film 400 is extended along a length of the side surface 113 of the display panel 350. In FIG. 1, for example, a length of the data-side flexible film 400 extends along a long side of the display panel 350. Referring to FIG. 1 and FIG. 4, for example, a length of the insulation structure 230 extends parallel to the length of the side surface 113 of the display panel 350 at which the data-side flexible film 400 extends. The insulation structure 230 may reduce or effectively prevent the common electrode 220 and the data connection electrode DSE from being bonded to each other in a process of forming the data connection electrode DSE during manufacturing of a display device according to the invention.

The display panel 350 may further include a sealant 330 disposed between the first and second substrates 100 and 200 to couple the first and second substrates 100 and 200 to each other. Here, the sealant 330 may be disposed spaced apart from the edge of the first and second substrate 100 to expose an end portion of the data pad electrode DPE which will be bonded to the data connection electrode DSE.

Although not shown, the display device 700 may further include a protection film that covers the data connection electrode DSE. The protection film functions to reduce or effectively prevent the data connection electrode DSE from being corroded by penetration of moisture from outside the display panel 350 and reduce or effectively prevent the data connection electrode DSE from malfunctioning due to introduction of foreign substances from the outside. The protection film may include or be made of an inorganic insulation material or an organic insulation material. In addition, the protection film may include or be made of a material having a damp-proofing function and/or an anti-static function.

In the top plan view of the display device 700, a bezel of the display panel 350 and/or the display device 700 may correspond to the non-display area thereof. To maximize a display area of the display panel 350 and/or the display device 700, a size of the bezel in the top plan view thereof is minimized.

As described above, the display device 700 may have a side bonding structure in which the data-side flexible film 400 is bonded to the side surface of the display panel 350. That is, the thickness (as a minimum dimension) of the bonded data-side flexible film 400 is disposed in a non-display area and/or a bezel area of the display panel 350 and/or the display device 700, rather than the major surface (e.g., length and width of the major surface viewable in FIG. 1) of the bonded data-side flexible film 400. Thus, since only the minimum-dimension thickness of the bonded data-side flexible film 400 contributes to the bezel area of the display panel 350, the bezel area of the display panel 350 may be reduced in size (e.g., in the top plan view).

Referring to FIG. 1, the thickness (as a minimum dimension) of the printed circuit board 600 may also be disposed in a non-display area and/or a bezel area of the display panel 350 and/or the display device 700, rather than the major surface (e.g., length and width of the major surface viewable in FIG. 1) of the printed circuit board 600. Thus, since only the minimum-dimension thickness of the printed circuit board 600 contributes to the bezel area of the display panel 350, the bezel area of the display panel 350 may be reduced in size (e.g., in the top plan view).

However, in one or more embodiment of the side bonding structure according to the invention, the data connection electrode DSE is not obscured between the data-side flexible film 400 and the side surface 113 of the first substrate 100, but is exposed to outside thereof and viewable from outside the display panel 350. Thus, the bonding state between the wiring electrode 420 and the data pad electrode DPE through the data connection electrode DSE may be easily inspected by using the naked eye.

Therefore, in one or more embodiment of the side bonding structure according to the invention, the bonding reliability between the data-side flexible film 400 and the display panel 350 may be improved.

Figure 5A:
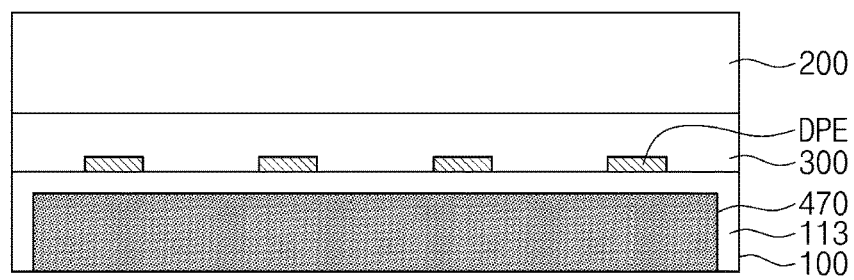
FIGS. 5A to 5C are views illustrating an exemplary embodiment of a process of attaching a flexible film to a display panel according to the invention.
Figure 5B:
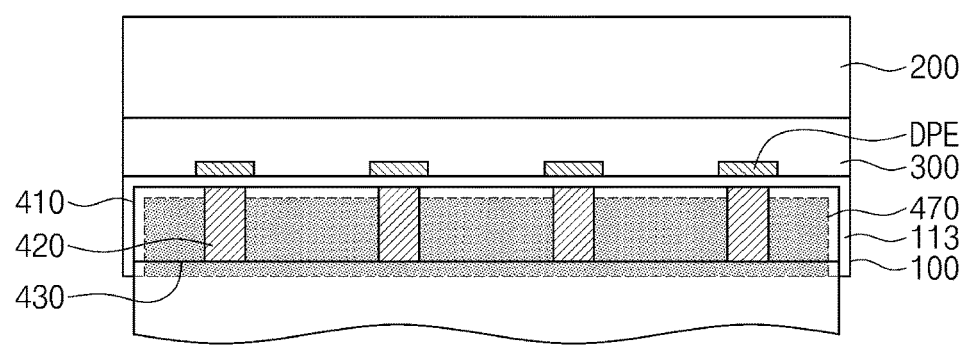
Figure 5C:
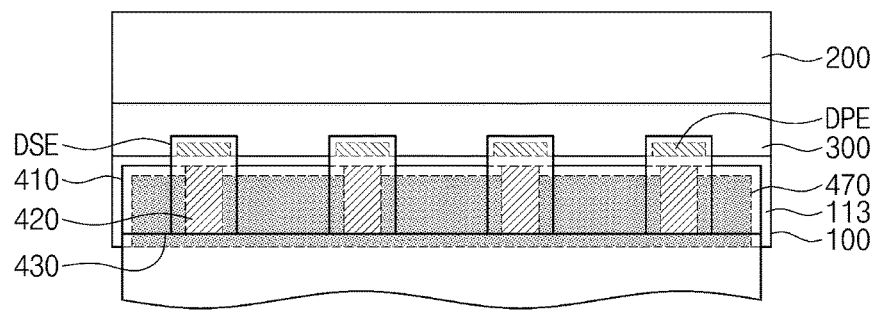

FIGS. 5A to 5C are cross-sectional views illustrating an exemplary embodiment of a process of attaching a flexible film to the display panel according to the invention. FIGS. 5A to 5C are views of a side surface of the display panel at which the flexible film is attached, showing a thickness direction of the display panel.

Referring to FIG. 5A, the adhesion member 470 is formed on the side surface 113 of the first substrate 100. A single adhesion member 470 may be commonly applied to each area at which plural flexible films will be attached. Plural discrete adhesion members may be respectively disposed corresponding to areas at which plural flexible films will be disposed. The adhesion member 470 may be formed as an adhesive film and then applied to the side surface, but the invention is not limited thereto.

The adhesion member 470 may include an arc polymer resin or a thermoplastic resin. The thermoplastic resin may be a vinyl acetate resin, a styrene resin, an ethylene-vinyl acetate copolymerization resin, or a styrene-butadiene copolymerization resin. Alternatively, the thermoplastic resin may be a polyester resin.

Referring to FIG. 5B, the data-side flexible film 400 including the base film 410, the wiring electrode 420 and the cover film 430 is attached to the adhesion member 470. The rear surface of the base film 410 may be attached to the adhesion member 470, and thus, the data-side flexible film 400 may be fixed to the first substrate 100. Here, the adhesion member 470 may have adhesive force greater than that of a conventional anisotropic conductive film including conductive particles. That is, since the adhesion member 470 does not include the conventional conductive particles that weaken the adhesive force of an adhesive film, the adhesive force by which the data-side flexible film 400 is attached to the first substrate 100 may be improved.

As illustrated in FIG. 5B, the wiring electrode 420 is disposed or formed on the front surface of the base film 410, and an end of the wiring electrode 420 is exposed to outside the data-side flexible film 400 without being covered by the cover film 430 thereof. A top edge of the cover film 430 is indicated with a solid line, ant the exposed portion of the wiring electrode 420 is extended above that solid line.

Also, the first substrate 100 may be coupled to the second substrate 200 to dispose the liquid crystal layer 300 to form the display panel 350. In the formed display panel 350, however, a portion of the data pad electrode DPE of the first substrate 100 is exposed to outside the display panel 350 as illustrated in the side view of the display panel 350.

Referring to FIG. 5C, the data connection electrode DSE for physically and electrically connecting the exposed portion of the wiring electrode 420 to the exposed portion of the data pad electrode DPE is formed. The data connection electrode DSE directly contacts the data pad electrode DPE disposed in one plane and extends from the one plane to a front surface of the wiring electrode 420 disposed in a different plane. In an exemplary embodiment, the data connection electrode DSE may be formed through a soldering manner, a silkscreen manner, a laser cutting manner after printing, or a stamp manner.

When the data connection electrode DSE is formed through the above-described manner, the data connection electrode DSE may be disposed outside the display panel 350 and outside the data-side flexible film 400 so that a user is able to easily confirm whether defects of the coupling between the data connection electrode DSE and each of the wiring electrode 420 and the data pad electrode DPE occur such as by using the naked eye.

Also, as described above, the data-side flexible film 400 may be an integral unit for which electrodes and wirings thereof are supported on a common base film 410. That is, surfaces of such electrodes and wirings are not used as contact surfaces to bond a flexible film to the display panel. Since the data-side flexible film 400 is attached to the side surface 113 of the first substrate 100 in the state in which only the adhesion member 470 is disposed between the data-side flexible film 400 and the side surface 113 (e.g., no wiring electrode 420, the side electrode, etc. disposed between the data-side flexible film 400 and the side surface 113), the adhesive force between the two members 400 and 100 may be improved. Also, the above-described bonding structure and integral structure of the data-side flexible film 400 may simplify a rework process that includes un-bonding the data-side flexible film 400 from the display panel 350, when compared to structures in which each of the wiring electrode, the side electrode, etc. of a conventional flexible film, is disposed between the flexible film and the side surface of the first substrate of a display panel.

Figure 6:
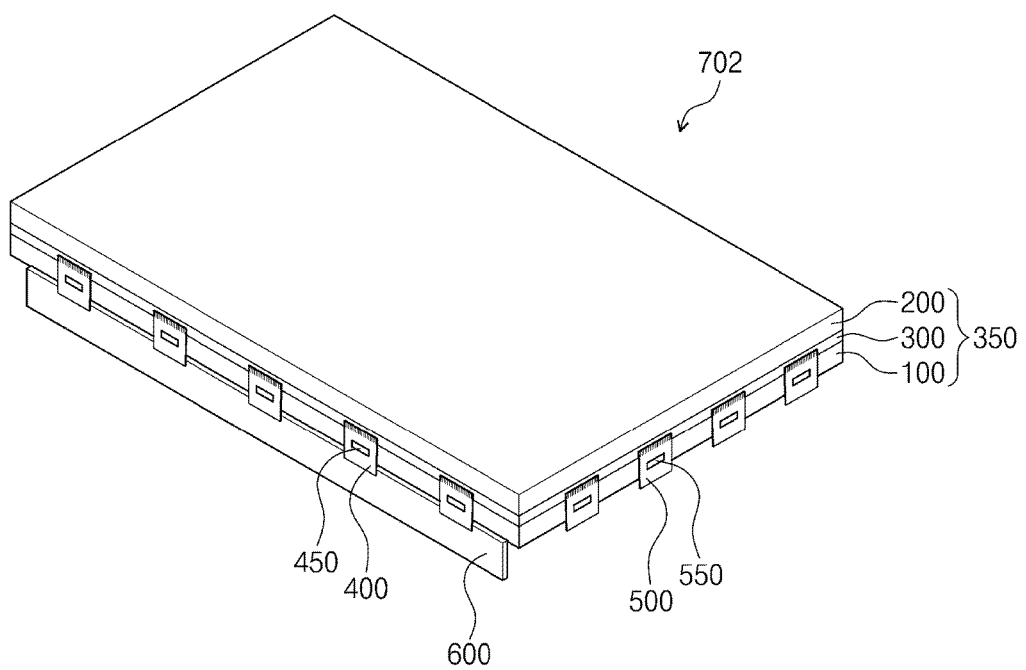
FIG. 6 is a perspective view of another exemplary embodiment of a display device according to the invention.
Figure 7:
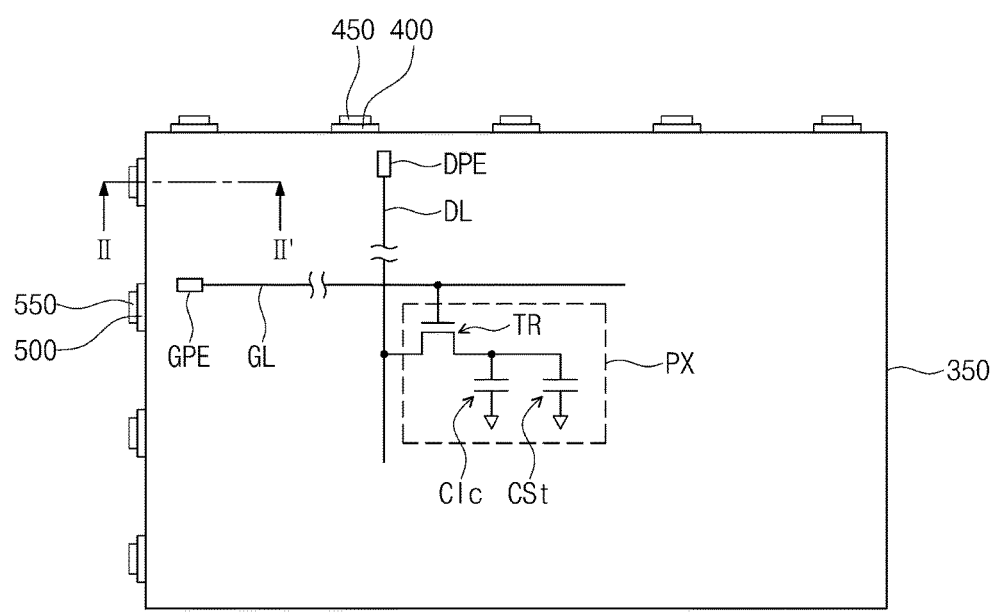
FIG. 7 is a schematic top plan view of the display device of FIG. 6.

FIG. 6 is a perspective view of another exemplary embodiment of a display device according to the invention, and FIG. 7 is a schematic plan view of the display device of FIG. 6. In FIG. 6, the same components as those of FIG. 1 will be designated by the same reference numeral, and their detailed descriptions will be omitted.

Referring to FIGS. 6 and 7, another exemplary embodiment of a display device 702 according to the invention includes a gate driving circuit connected to a gate line GL to supply a gate signal to the gate line GL. According to an exemplary embodiment of the invention, the gate driving circuit may be constituted by a gate driving chip 550 provided in plurality. That is, the gate driving circuit may be constituted by the plurality of gate driving chips 550, and the plurality of gate driving chips 550 may be respectively mounted on gate-side flexible films 500. The gate-side flexible films 500 are attached to a side surface (e.g., a side surface 113 of a first substrate 100) of a display panel 350.

The first base substrate 110 includes a first surface 111, a second surface 112 which is opposite to the first surface 111, and a side surface 113 provided in plurality each connecting the first surface 111 to the second surface 112. The plurality of side surfaces 113 may include at least four surfaces. Here, a side surface of the first substrate 100 to which the gate-side flexible films 500 are attached may be different from a side surface of the first substrate 100 to which a data-side flexible film 400 is attached.

In this case, the data-side flexible film 400 receives various signals for driving the gate driving chip 550 from a printed circuit board 600 to supply the received signals to the gate driving chip 550. Although not shown, wirings for transmitting the signals to the gate flexible film 500 from the data-side flexible film 400 may be disposed on the display panel 350, but the invention is not limited thereto.

The first substrate 100 of the display panel 350 further includes a gate pad electrode GPE extending from the gate line GL. The gate pad electrode GPE may extend from one end of the gate line GL and be disposed at an end or edge area of the first substrate 100. The gate line GL may extend to define the gate pad electrode GPE.

Figure 8:
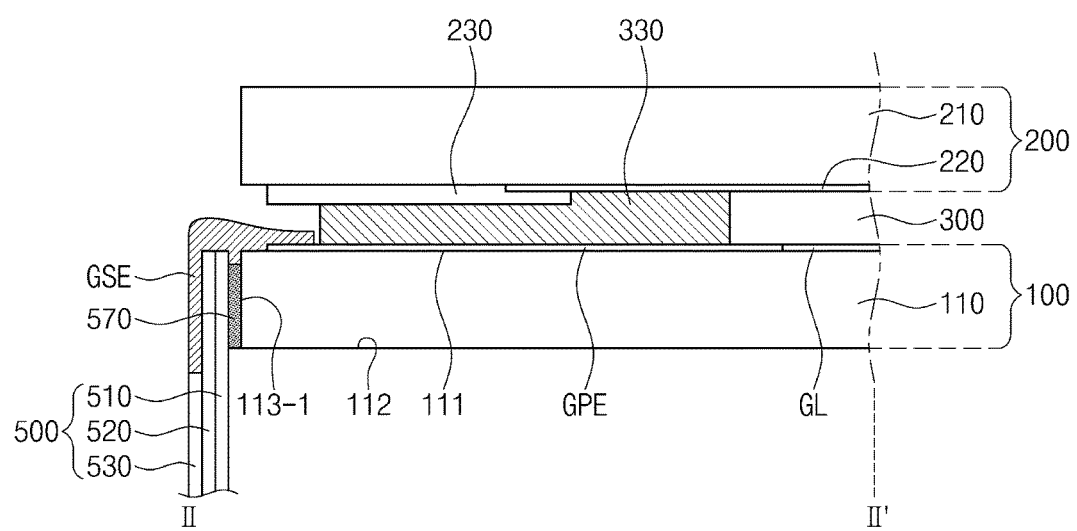
FIG. 8 is a cross-sectional view of an exemplary embodiment of an edge portion of the display device taken along line II-IF of FIG. 7.

FIG. 8 is a cross-sectional view of an exemplary embodiment of an edge portion of the display device taken along line II-II' of FIG. 7. In FIG. 8, the same components as those of FIG. 4 will be designated by the same reference numeral, and their detailed descriptions will be omitted.

Referring to FIG. 8, the gate line GL and the gate pad electrode GPE of FIG. 7 are disposed on a first surface 111 of the first base substrate 110.

For convenience of description, although other members except for the gate line GL and the gate pad electrode GPE are omitted, other members disposed on the first substrate 100 may be disposed on the first base substrate 110 such as on the first surface 111 thereof.

The gate-side flexible film 500 is attached to a side surface 113-1 of the first base substrate 110, different from the side surface 113 of the first base substrate to which the data-side flexible film 400 is attached in FIG. 4.

The gate-side flexible film 500 may be disposed extended parallel to the side surface 113-1 of the first substrate 100. The gate-side flexible film 500 includes a base film 510, a wiring electrode 520 disposed on a front surface of the base film 510, and a cover film 530 covering the wiring electrode 520. Each of the base film 510, the wiring electrode 520 and the cover film 530 may be disposed in planes parallel to that of the side surface 113-1.

The base film 510 may include or be made of a flexible material, e.g., polyimide. The wiring electrode 520 may be connected to a gate driving chip (see reference numeral 550 of FIG. 6) to receive a signal outputted from the gate driving chip 550. The wiring electrode 520 has an end exposed by the cover film 530. The wiring electrode 520 may include or be made of a metal material including copper (Cu), silver (Ag), gold (Au), or aluminum (Al).

The display device 702 further includes an adhesion member 570 disposed between the gate-side flexible film 500 and the side surface 113-1 of the first substrate 100 to attach the gate-side flexible film 500 to the side surface 113-1. Particularly, the adhesion member 570 is disposed between a rear surface of the base film 510 opposite to the front surface thereof and the side surface 113-1 of the first substrate 110.

The adhesion member 570 includes or is made of a material having adhesive force. The adhesion member 570 physically fixes the gate-side flexible film 500 to the side surface 113-1 of the first substrate 100. The adhesion member 570 may include an arc polymer resin and/or a thermoplastic resin.

The display device 702 may further include a gate connection electrode GSE that is directly bonded to the gate pad electrode GPE and the wiring electrode 520 to electrically connect the gate line GL to the wiring electrode 520. The gate connection electrode GSE may include a metal material such as including silver (Ag) or carbon (C).

At the end portion of the first substrate 100, a distal portion of the gate pad electrode GPE may be exposed to outside the display panel 350. The exposed distal portion of the gate pad electrode GPE is directly bonded to the gate connection electrode GSE. The gate connection electrode GSE covers the exposed portion of the gate pad electrode GPE. The gate connection electrode GSE may be disposed on an upper surface of the exposed portion of the gate pad electrode GPE and extend along side surfaces thereof toward the base substrate 110. That is, the gate connection electrode GSE is disposed in two planes. One plane is parallel to a plane of the first surface 111 of the first base substrate 110 and another plane is parallel to a plane of the side surface 113 of the first base substrate 110.

Also, the gate connection electrode GSE covers an end of the wiring electrode 520, which is not covered by the cover film 530. The gate connection electrode GSE may overlap an entirety of the front surface and the side surfaces of the wiring electrode 520 exposed by the cover film 530. According to an exemplary embodiment of manufacturing the display device, the gate connection electrode GSE may be formed in a printing or soldering manner. The gate connection electrode GSE is physically bonded to the gate pad electrode GPE and the wiring electrode 520 to provide a path for electrically conducting the gate pad electrode GPE to the wiring electrode 520. The gate connection electrode GSE is common to both the gate pad electrode GPE and the wiring electrode 520.

Although not shown, the display device 702 may further include a protection film that covers the gate connection electrode GSE. The protection film functions to reduce or effectively prevent the gate connection electrode GSE from being corroded by penetration of moisture from outside the display panel 350 and reduce or effectively prevent the gate connection electrode GSE from malfunctioning due to introduction of foreign substances from the outside. The protection film may include or be made of an inorganic insulation material or an organic insulation material. In addition, the protection film may include or be made of a material having a damp-proofing function and/or an anti-static function.

As described above, the display device 702 may have a side bonding structure in which the gate-side flexible film 500 is bonded to the side surface of the display panel 350. That is, similar to that described for the data-side flexible film 400, the thickness of the bonded gate-side flexible film 500 is disposed in a non-display area and/or a bezel area of the display panel 350 and/or the display device 702, rather than the major surface of the bonded gate-side flexible film 500. Thus, since only the thickness of the bonded gate-side flexible film 500 contributes to the bezel area of the display panel 350, the bezel area of the display panel 350 may be reduced in size (e.g., in the top plan view).

However, in one or more embodiment of the side bonding structure according to the invention, the gate connection electrode GSE is not obscured between the gate-side flexible film 500 and the side surface 113-1 of the first substrate 100, but is exposed to outside thereof and viewable from outside the display panel 350. Thus, the bonding state between the wiring electrode 520 and the gate pad electrode GPE through the gate connection electrode GSE may be easily inspected by using the naked eye.

Therefore, in one or more embodiment of the side bonding structure according to the invention, the bonding reliability between the gate-side flexible film 500 and the display panel 350 may be improved.

According to one or more embodiment of the invention, in the side bonding structure capable of reducing the size of the bezel area, the connection electrode may not be disposed obscured between the side surfaces of the first substrate, but instead is disposed exposed outside the display panel. Thus, the state of the bonding between the wiring electrode of the flexible film and the pad electrode of the display panel, through the connection electrode, may be easily inspected such as by using the naked eye to improve the reliability in electrical connection between the flexible film and the display panel.

Also, according to one or more embodiment of the invention, only the base film of the flexible film may directly contact the adhesion member to attach the flexible film to the side surface of the panel, to increase the physical contact force between the flexible film and the display panel.

It will be apparent to those skilled in the art that various modifications and variations can be made in the present disclosure. Thus, it is intended that the present disclosure covers the modifications and variations of the invention provided they come within the scope of the appended claims and their equivalents.

What is claimed is:
1. A display device comprising:
a display panel which displays an image, the display panel comprising a display signal line and a pad electrode which extends from the display signal line;
a flexible film from which a display signal is provided to the pad electrode of the display panel, the flexible film comprising:
a base film attached to a side surface of the display panel and including a front surface facing away from the side surface of the display panel, and
a wiring electrode disposed on the front surface of the base film;
an adhesion member configured to attach the flexible film to the side surface of the display panel; and
a connection electrode directly bonded to the pad electrode of the display panel and the wiring electrode of the flexible film to electrically connect the display signal line of the display panel to the wiring electrode of the flexible film.

2. The display device of claim 1, wherein
the display panel comprises a first substrate in which the display signal line and the pad electrode are disposed, a second substrate facing the first substrate, and an optical medium layer disposed between the first substrate and the second substrate, and
the flexible film is attached to a side surface of the first substrate.

3. The display device of claim 2, wherein
the first substrate further comprises a first base substrate comprising a first surface and a second surface opposite to the first surface, and a side surface which connects the first surface to the second surface, the side surface of the first base substrate defining the side surface of the display panel,
the display signal line and the pad electrode are disposed on one of the first and second surfaces of the first base substrate,
the wiring electrode of the flexible film includes a front surface which faces away from the side surface of the first base substrate and an end portion of the front surface of the wiring electrode is exposed outside the flexible film,
an end portion of the pad electrode of the display panel is exposed outside the display panel, and
the connection electrode directly contacts the exposed end portion of the pad electrode and extends to contact the exposed end portion of the front surface of the wiring electrode.

4. The display device of claim 3, wherein
the flexible film further comprises a cover film which is coupled to the base film and covers a remaining portion of the front surface of the wiring electrode except for the exposed end portion of the front surface of the wiring electrode which is bonded to the connection electrode.

5. The display device of claim 2, wherein
the second substrate comprises:
a second base substrate;
a common electrode disposed on the second base substrate; and
an insulation structure disposed on the common electrode and extending parallel to the side surface of the display panel at which the flexible film is attached.

6. The display device of claim 5, further comprising a sealant disposed between the first and second substrates to couple the first and second substrates to each other,
wherein an end portion of the pad electrode of the display panel is exposed outside the sealant coupling the first and second substrates to each other.

7. The display device of claim 1, wherein the connection electrode comprises a metal material comprising silver or carbon.

8. The display device of claim 1, wherein
the flexible film comprises a data-side flexible film from which a data signal is provided to the display panel, and
the display device further comprises a data driving chip mounted on the data-side flexible film.

9. The display device of claim 1, wherein
the flexible film is provided in plurality and comprises a data-side flexible film and a gate-side flexible film respectively providing a data signal and a gate signal to the display panel, and
the display device further comprises:

a data driving chip mounted on the data-side flexible film; and
a gate driving chip mounted on the gate-side flexible film.

10. The display device of claim 1, wherein the adhesion member is disposed between a rear surface of the base film opposite to the front surface thereof, and the side surface of the display panel.

11. The display device of claim 1, wherein
a total planar area of the front surface of the base film defines a major planar dimension of the flexible film,
a thickness of the flexible film is taken from the front surface thereof to the side surface of the first substrate of the display panel, and
a total planar area of the flexible film in a thickness view thereof defines a minor planar dimension of the flexible film.

12. A method for manufacturing a display device, the method comprising:
coupling a first substrate comprising a display signal line and a pad electrode which extends from the display signal line, to a second substrate facing the first substrate, to form a display panel which displays an image;
forming an adhesion member on a side surface of the first substrate of the display panel;
preparing a flexible film from which a display signal is provided to the pad electrode of the display panel, the flexible film comprising a base film and a wiring electrode which is disposed on a front surface of the base film;
attaching the flexible film to the side surface of the first substrate, by disposing the base film of the flexible film between the wiring electrode thereof and the adhesion member which is formed on the side surface of the first substrate; and
forming a connection electrode extended from an exposed end portion of the wiring electrode of the flexible film to an exposed end portion of the pad electrode of the display panel, to physically and electrically connect the wiring electrode to the pad electrode.

13. The method of claim 12, wherein the connection electrode comprises a metal material comprising silver or carbon.

14. The method of claim 12, wherein the forming of the connection electrode comprises printing or soldering a metal material on the display panel after the attaching the flexible film to the side surface of the first substrate.

15. The method of claim 12, wherein the second substrate comprises:
a common electrode on a base substrate; and
an insulation structure disposed on the common electrode to extend parallel to the side surface of the first substrate of the display panel to which the flexible film is attached.

16. The method of claim 12, wherein
the flexible film comprises a data-side flexible film from which a data signal is provided to the display panel, and
the display device comprises a data driving chip mounted on the data-side flexible film.

17. The method of claim 12, wherein
the flexible film is provided in plurality and comprises a data-side flexible film and a gate-side flexible film respectively providing a data signal and a gate signal to the display panel, and
the display device comprises:
a data driving chip mounted on the data-side flexible film; and a gate driving chip mounted on the gate-side flexible film.

\* \* \* \* \*